United States Patent
Imanishi et al.

[11] Patent Number: 6,118,574
[45] Date of Patent: Sep. 12, 2000

[54] EXPOSURE APPARATUS

[75] Inventors: Shingo Imanishi, Kanagawa; Shin Masuhara, Tokyo; Hisayuki Yamatsu, Tokyo; Toshiyuki Kashiwagi, Tokyo, all of Japan

[73] Assignee: Sony Corporation, Tokyo, Japan

[21] Appl. No.: 09/059,259

[22] Filed: Apr. 14, 1998

[30] Foreign Application Priority Data

Apr. 16, 1997 [JP] Japan ..................................... 9-099198

[51] Int. Cl.⁷ .................. G02F 1/33; G11B 7/00; G11B 7/0037
[52] U.S. Cl. .................. 359/305; 369/119; 369/44.13
[58] Field of Search .................. 369/119, 16, 118, 369/116, 100, 44.13, 107; 359/285, 305, 310

[56] References Cited

U.S. PATENT DOCUMENTS

| | | | |
|---|---|---|---|
| 4,982,398 | 1/1991 | Yamamoto et al. | 369/119 |
| 5,230,770 | 7/1993 | Kashiwagi | 156/643 |
| 5,238,786 | 8/1993 | Kashiwagi | 430/321 |

OTHER PUBLICATIONS

International Search Report for PCT Application No. PCT/JP99/03089.

Primary Examiner—Margaret Burke
Attorney, Agent, or Firm—Ronald P. Kananen; Rader, Fishman & Grauer

[57] ABSTRACT

An exposure apparatus to expose a photo-sensitive layer formed on a substrate of a recording media is disclosed which comprises an exposure light source; a first means of focusing a light from the light source; an acousto-optic modulator disposed off the focal plane of the first focusing means to modulate the light focused by the first focusing means according to a signal to be recorded; and a second means of focusing the light modulated by the acousto-optic modulator onto the photo-sensitive layer formed on the substrate of the recording media.

14 Claims, 15 Drawing Sheets

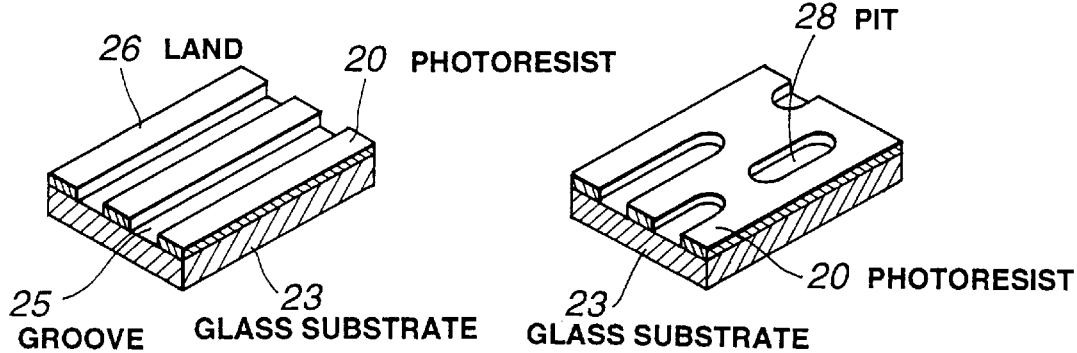
FIG.3A   FIG.3B
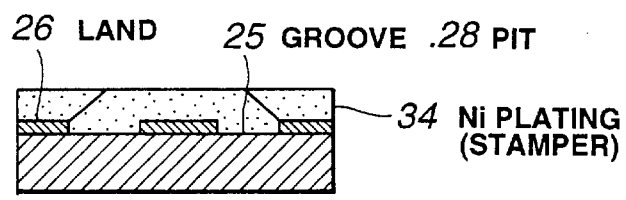
FIG.3C
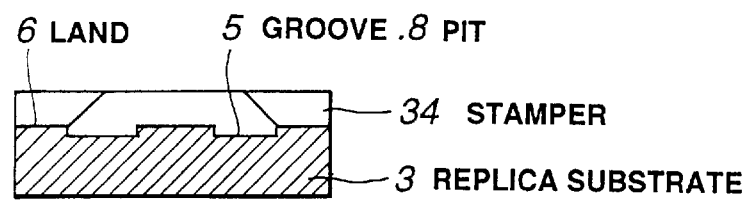
FIG.3D

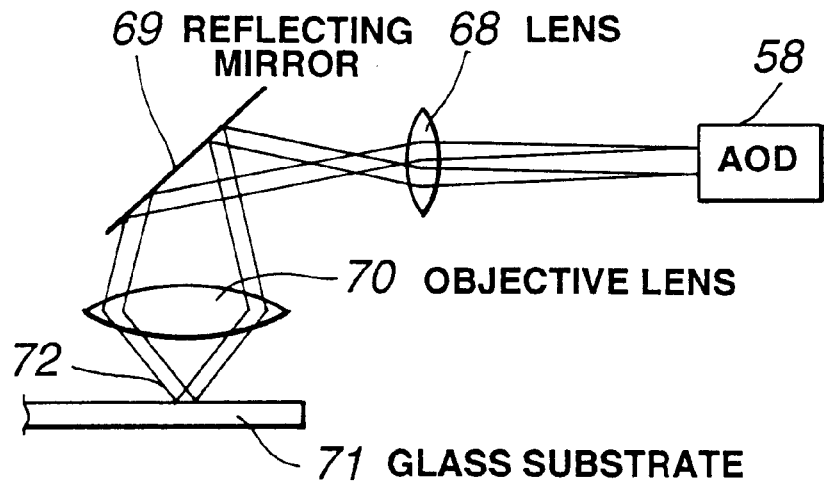
FIG.5
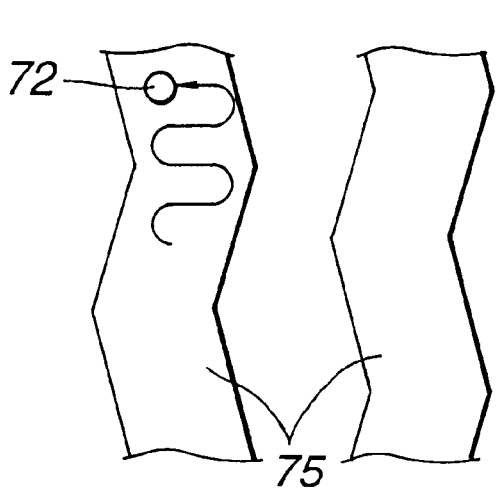 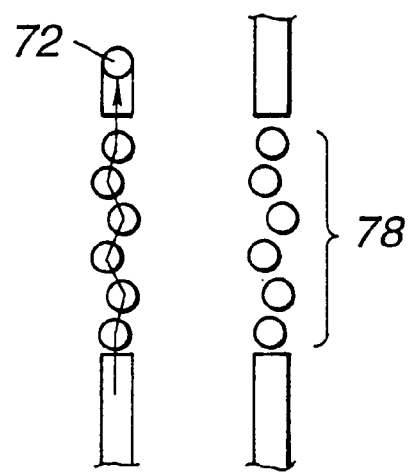
FIG.6A      FIG.6B

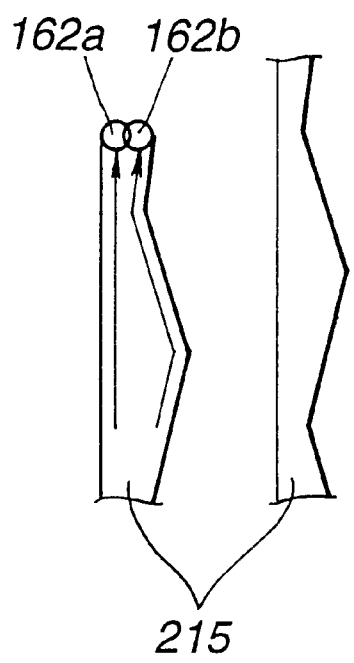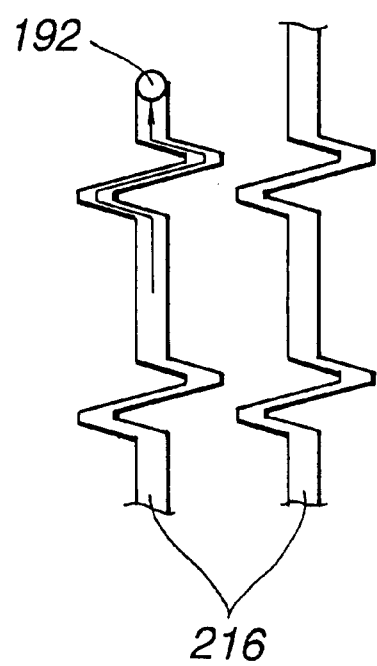
FIG.18A   FIG.18B

EXPOSURE APPARATUS

BACKGROUND OF THE INVENTION

1. Field of the Invention

The present invention relates to an exposure apparatus for producing a mastering disc for use to manufacture a recording media such as an optical disc or the like.

2. Description of Related Art

An optical disc as a recording media to record signals at a high density is produced by stamping, using an injection molding, lands and grooves formed on a mastering disc and corresponding to a signal to be recorded.

FIGS. 1A to 1C show the construction of an optical disc 1 produced as mentioned above. FIG. 1A shows the optical disc 1 having a signal recording area 2 defined on a disc substrate 3 made of an optically transparent plastic. Within the signal recording area 2, the disc substrate 3 has grooves 5 or a succession of pits 8 formed spirally on one side (signal side) 4 thereof at predetermined pitches P of 1 to 2 $\mu$m. FIG. 1B shows the grooves 5, and FIG. 1C shows the pits 8. The grooves 5 and pits 8 are formed as periodically wobbled radially of the optical disc 1 as the case may be.

Normally, in an phase-change based optical disc or a magneto-optic disc, being a recordable optical disc, either the lands or grooves (lands 6, for example) formed on the signal side 5 by stamping them from a mastering disc are defined as a recording area, while the other (grooves 5, for example) are defined as a light reflecting area for tracking use. In case the grooves 5 or a succession of pits 8 are formed as wobbled, a periodic change of them is used as an address information over the entire optical disc 1. In a read-only optical disc, a succession of pits 8 on the signal side 4 are normally used as a recording area and tracking diffraction grating.

It should be noted that a recording layer made of a phase-change or magnetic film, a light reflecting layer, a protective layer, etc. are also formed on the signal side 4 on which the grooves 5 have also formed.

For recording or reproducing a signal into or from the optical disc 1, a laser light is irradiated from an optical pick-up to a reading side 7 of the optical disc 1 opposite to the signal side 4 while the optical disc 1 is being spun. If the optical disc 1 is of a recordable type, a signal is optically written into the recording layer on the land 6, for example, with the laser light irradiated onto the recording layer. Also, a signal optically written on the optical disc 1 is read with a laser light reflected from the optical disc 1.

Further, a tracking is controlled by detecting a reflected light from the groove 5, for example, to assure that a laser light for signal write and/or read can always be irradiated onto a predetermined track. In the case of a read-only optical disc, the laser light irradiated to the reading side 7 is detected as a reflected light and diffracted light from the signal side 4 on which a succession of pits 8 are formed to read a signal and control the tracking.

Since the performance of an optical disc as a recording media depends upon lands and grooves formed on the signal side of the optical disc, it has been required that the lands and grooves should be stamped with a high accuracy onto an optical disc from a mastering disc.

FIGS. 2A to 2C generally show together the process of forming a mastering disc for an optical disc.

First, a circular glass substrate 23 of which the surfaces have been sufficiently polished flat and washed is prepared as shown in FIG. 2A. Then, a photoresist made alkali-soluble when exposed to a light is applied to the glass substrate 23 as shown in FIG. 2B. Generally, this photoresist coating is done to a layer 20 of 0.1 $\mu$m or so in thickness while the glass substrate 23 is being spun by a spinner.

Next, a signal recording laser light 31 is focused by a lens 32 onto the photoresist layer 20 as shown in FIG. 2C. At this time, while the glass substrate 23 is being spun, the laser light 31 can be shifted a predetermined distance per spin radially of the glass substrate 23 to form a latent groove image 33 spirally at predetermined intervals (track pitch P) on the photoresist layer 20. By irradiating the laser light 31 intermittently, a latent pit-train image 33 can be similarly formed on the photoresist layer 20. Further, by periodically deflecting the laser light 31 radially of the glass substrate 2, the latent image of grooves or succession of pits can be wobbled.

The exposure apparatus used here is called a laser cutting apparatus. It comprises a laser source to generate a laser light to which the photoresist layer 20 on the glass substrate 23 is exposed to record a signal, an optic modulator to modulate the laser light correspondingly to a signal to be recorded, an optical system to collimate the laser light onto the photoresist layer 20, an optical surface plate to turn the glass substrate and move the exposure position, etc.

FIGS. 3A to 3D show the process of developing in an alkaline developing solution an exposed glass substrate (subjected to a laser cutting process) as shown in FIG. 2C to remove, by melting with the laser light heat, a portion of the photoresist layer exposed to the laser light and thus made alkali-soluble.

FIGS. 3A and 3B show the developed glass substrates 23, respectively. FIG. 3A shows a mastering disc for a recordable optical disc having formed thereon grooves 25 resulted from the exposure to the laser light and melt-removal of the photoresist layer 20 and a land 26 remaining between the grooves 25. The grooves 25 and lands 26 are formed alternately radially of the mastering disc. FIG. 3B shows a mastering disc for a read-only optical disc having formed thereon a succession of pits 28 resulted from the exposure to the laser light and melt-removal of the photoresist 20. The pits 28 are formed repeatedly radially of the mastering disc.

As shown in FIG. 3C, the glass substrate 23 having grooves, lands or pits formed in the photoresist layer 20 through the development is plated with nickel to form a stamper 34 having grooves 25 or succession of pits 28 stamped thereon from the photoresist layer 20.

As shown in FIG. 3D, the grooves and lands or succession of pits of the stamper 34 are stamped to a plastic material for an optical disc substrate by an injection molding or the like method to form a disc substrate (replica substrate) 3 having the grooves 5 and lands 6 or a succession of pits 8.

It should be noted that the replica substrate 3 for a recordable optical disc has further a recording layer, a reflective layer, and a protective layer formed on the signal side 4 thereof where the grooves 5 have already been formed. Also, the replica substrate 3 for a read-only optical disc has further a reflective layer and a protective layer formed on the signal side 4 thereof where the pits 8 of the disc substrate 3 have already been formed.

In forming the above-mentioned mastering disc for an optical disc, an AOM (acousto-optic modulator) is used to select whether or not the photoresist 20 on the glass substrate 23 is exposed to a laser light. Also, an AOD (acousto-optic deflector) is used to deflect the exposure laser light for wobbling an exposure position of a photoresist layer radially of the optical disc. The construction and principle of operation of the AOM and AOD will be further discussed later.

FIG. 4 shows an example of optical system used in a conventional exposure apparatus incorporating an AOM and AOD.

The exposure apparatus has an optical path in which an AOM 62 is provided to modulate a laser light from an exposure laser source 52, and an optical path in which an AOD 58 is provided to deflect the laser light modulated by the AOM 55.

In this exposure apparatus, if no deflection of the laser light is intended, the laser light emitted from the laser source 52 is reflected by a reflecting mirror 60 provided on a stationary optical surface plate 50, focused by a lens 61, and modulated by the AOM 62. A divergent light after modulated by the AOM 62 is collimated by a lens 63, reflected by a beam splitter 64, passed through a half wavelength plate 65, passed through a polarizing beam splitter 66 on a moving optical surface plate 51 and a quarter wavelength plate 67, focused by a lens 68, and then focused by an objective lens 70 onto a glass substrate 71. The half and quarter wavelength plates 65 and 67 are provided to prevent the laser light from returning to the laser source.

If it is not intended to deflect the laser light in this exposure apparatus, the laser light emitted from the exposure laser source 52 is reflected by a beam splitter 53 provided on the stationary optical surface plate 50, focused by a lens 54, and modulated by the AOM 55. A divergent light after modulated is collimated by a lens 56, reflected by a reflecting mirror 57, deflected by the AOD 58 provided on the moving optical surface plate 51, reflected by a reflecting mirror 59 and polarizing beam splitter 66, focused by the lens 68 and them focused by the objective lens 70 onto the glass substrate 71.

A part of the laser light modulated by the AOM 62 is guided by the beam splitter 64 to a CCD 72 for monitoring.

FIG. 5 is a view, from the lateral side, of the optical system on the moving optical surface plate 51 of this exposure apparatus. As shown, the laser light deflected (wobbled) by the AOD 58 is focused by the lens 68, then reflected downward by a reflecting mirror 69, and focused by the objective lens 70 onto a spot 72 on the glass substrate 71.

It should be noted that since the glass substrate 71 is turned on a turn table at a predetermined speed, it is spirally exposed to the laser light by parallel moving the moving optical surface plate 51 radially of the glass substrate 71.

FIGS. 6A and 6B show in detail the shape of grooves in an optical disc produced by a conventional exposure apparatus provided with an optical system incorporating an AOD to deflect an exposure laser light.

FIG. 6A shows the shape of grooves 75 formed in a recordable magneto-optic disc of 64 mm in diameter, called "mini-disc". The grooves in this magneto-optic disc are resulted from wobbling of grooves (wide grooves) wider than those in normal optical discs. More particularly, the land is 0.5 μm wide, groove is 1.1 μm wide, and the track pitch P is 1.6 μm. That is, the width of the grooves 75 is larger than the diameter of a focused laser spot 72 on a mastering disc. A mastering disc for forming the grooves 75 is turned more slowly than a mastering disc for a normal optical disc, and the focused laser spot 72 is deflected by the AOD over the width of the groove 75 to cover the entire width of the groove with the laser light.

The groove 75 has a shape periodically wobbled by deflecting the focused laser spot 72 radially of the optical disc by the AOD. The amplitude of the wobbling is as small as ±0.03 μm. Also, the frequency of this wobbling is lower than the frequency of deflecting the laser light to cover the entire width of the groove, and the central value of the frequency of a signal (carrier frequency) to drive the AOD is changed periodically with this wobbling frequency.

FIG. 6B shows the shape of a groove formed in a magneto-optic disc of 88 mm in diameter called "HS disc" conforming to the ECMA (European Computer Machinery Association) Standard 239. In this magneto-optic disc, the wobbled succession of pits 78 is inserted in a space appearing periodically in the middle of a groove. The track pitch P is 1.2 μm.

A mastering disc used to form the wobbled succession of pits has pits formed thereon by modulating an exposure laser light by the AOM (acousto-optic modulator) and deflecting the laser light by the AOD. The succession of pits 78 is thus wobbled correspondingly in the magneto-optic disc.

The AOM and AOD, acousto-optic effect elements, used in the exposure apparatus for preparing an mastering disc for an optical disc are disadvantageous in that if a period of refractive index compressional wave varies in a passage of an incoming laser light, an outgoing direction of first-order diffracted light will not be univocally be determinable so that the laser light will be diffracted in many directions at a same time. This phenomenon is called "cylindrical effect". The higher the frequency of laser beam deflection, or the larger the diameter of a laser beam passing through a crystal, the cylindrical effect will be correspondingly higher. The cylindrical effect will be further discussed later.

Furthermore, the AOM is disadvantageous in that if the beam diameter of the incoming laser light is larger, the frequency of modulation cannot be higher.

FIG. 7 shows a typical optical system designed to reduce the diameter of a laser beam passing through the AOM in order to avoid the above problem. That is, a laser light 90 is focused by a collimating lens 91. An AOM 92 is provided at the focal plane to reduce the diameter of a laser light through the AOM 92.

This optical system enables the AOM 92 to modulate a laser light at a high speed. However, the AOM 92 cannot change the traveling direction of the laser beam. Therefore, when this optical system is employed in an exposure apparatus, the exposure position of a laser light on a glass substrate cannot be changed, so that grooves and succession of pits cannot be wobbled.

FIG. 8 shows an example of optical system adapted to make a laser light incident upon the AOD, not focused, to thereby change the exposure position on a mastering disc, thus avoiding the above problem. When adopted in an exposure apparatus, however, this optical system will permit to change the exposure position of a laser light on a mastering disc, but the speed (frequency) of deflection at which no cylindrical effect takes place is low because the diameter of a laser beam incident upon the AOD is large. That is, the frequency of wobbling grooves or succession of pits on a mastering disc cannot be high, so that exposure of the entire mastering disc will take a longer time.

FIG. 9 shows an example of optical system used in a conventional exposure apparatus and adapted to modulate and also deflect an exposure laser light at a high speed to avoid the above problem.

In this exposure apparatus, there are provided an optical path for a laser light emitted from an exposure laser source 112, separated by a beam splitter 113 and reflected by reflecting mirrors 117 and 119, and an optical path for a laser light passing through the beam splitter 113, reflected by a reflecting mirror 120 and then by a beam splitter 124 and passing through a half wavelength plate 125. The laser beams traveling along these two optical paths are passed through a polarizing beam splitter 126 and a quarter wavelength plate 127, focused by a lens 128 and modulated by an AOM 114. A divergent light after modulated by the AOM 114 is focused by an objective lens 130 onto a glass substrate 131. The half wavelength plate 125 and quarter wavelength plate 127 are provided to prevent the laser light from returning to the laser source.

Also, a part of the laser light is guided by the beam splitter 124 to a CCD 132 for monitoring.

FIG. 10 is a view, from the lateral side, of the optical system on a moving optical surface plate 111 of the exposure apparatus. As seen, the laser light modulated by the AOM 114 is reflected downward by the reflecting mirror 129 and focused by the objective lens 130 onto a spot 132 on the glass substrate 131. It should be noted that since in this exposure apparatus, the AOM 114 is somewhat off the rear focal plane of the objective lens 128 to simultaneously attain a high speed modulation and deflection of the laser light.

It should also be noted that since the glass substrate 131 is turned on a turn table at a predetermined speed, it is spirally exposed to the laser light by parallel moving the moving optical surface plate 111 radially of the glass substrate 131.

However, when two laser beams resulted from splitting of a laser light from the exposure laser source 112 by the beam splitter 113 are used simultaneously, they cannot be modulated and deflected independently of each other.

FIG. 11 shows another example of optical system used in a conventional exposure apparatus and adapted to modulate and deflect an exposure laser light at a high speed to avoid the above problem.

The exposure apparatus employs an optical system using an infinite objective lens 160. The optical system has two optical paths. An AOM 152 is provided in one of the optical paths to modulate one of the two beams resulted from splitting by a laser light by a beam splitter 143, and an AOM 145 is provided in the other optical path to modulate the other of the two laser beams.

When no deflection of the laser light is intended in this exposure apparatus, the laser light emitted from the exposure laser source 142 is reflected by a reflecting mirror 150 provided on a stationary optical surface plate 140, and focused onto the AOM 152 which will modulate the laser light. A divergent light after modulated by the AOM 152 is collimated by a lens 153, reflected by a beam splitter 154, passed through a half wavelength plate 155, also passed through a polarizing beam splitter 156 and quarter wavelength plate 157 on a moving optical surface plate 141, and focused by the objective lens 160 onto a glass substrate 161. Note that the half and quarter wavelength plates 155 and 157 are provided to prevent the laser light from returning to the laser source.

When it is intended to deflect the laser light in this exposure apparatus, the laser light emitted from the exposure laser source 142 is reflected by a beam splitter 143 provided on the stationary optical surface plate 140, focused by a lens 144 and modulated by the AOM 145. A divergent light after modulated is collimated by a lens 146, reflected by a reflecting mirror 147, and deflected (wobbled) by an AOD 148 provided on the moving optical surface plate 141. Then, the laser light is reflected by a reflecting mirror 149, passed through the quarter wavelength plate 148 and focused by the objective lens 160 onto the glass substrate 161.

Also, a part of the laser light modulated by the AOM 152 is guided by the beam splitter 154 to a CCD 162 for monitoring.

FIG. 12 is a view, from the lateral side, of the optical system on the moving optical surface plate 141 in the exposure apparatus. As seen, the laser light deflected by the AOD 148 is reflected downward by the reflecting mirror 159, and focused by the objective lens 160 onto spots 162*a* and 162*b* on the glass substrate 161.

It should be noted that since the glass substrate 161 is turned on a turn table at a predetermined speed, it is spirally exposed to the laser beams by parallel moving the moving optical surface plate 141 radially of the glass substrate 161.

However, the conventional exposure apparatus is disadvantageous in that since the focus plane on which the AOM is to be placed is infinitely far, the optical system as shown in FIG. 7 cannot be applied to an optical system intended to reduce the diameter of the laser beam passing through the AOM as shown in FIG. 7.

SUMMARY OF THE INVENTION

Accordingly, the present invention has an object to overcome the above-mentioned drawbacks of the prior art by providing an exposure apparatus adapted to modulate an exposure laser beam at a high speed while deflecting it at a sufficient amplitude and also to use a plurality of laser beams without any complicated optical system.

The above object can be accomplished by providing an exposure apparatus to expose by light a photo-sensitive layer formed on a substrate of a recording media, comprising, according to the present invention an exposure light source; a first means of focusing a light from the light source; an acousto-optic modulator disposed off the focal plane of the first focusing means to modulate the light focused by the first focusing means according to a signal to be recorded; and a second means of focusing the light modulated by the acousto-optic modulator onto the photo-sensitive layer formed on the substrate of the recording media.

The above object can also be accomplished by providing an exposure apparatus to expose by light a photo-sensitive layer formed on a substrate of a recording media, comprising, according to the present invention, an exposure light source; means of splitting the light from the light source into two beams; two first means of focusing the split beams, respectively; a first acousto-optic modulator disposed off the focal plane of one of the first focusing means to modulate the light focused by one of the first focusing means according to a signal to be recorded; a second acousto-optic modulator disposed at the focal plane of the other first focusing means to modulate the light focused by the other first focusing means according to a signal to be recorded; means of combining into one beam the two beams resulted from splitting by the beam splitting means; and a second means of focusing the light modulated by the acousto-optic modulator onto the photo-sensitive layer formed on the substrate of the recording media.

According to the present invention, a single acousto-optical modulator (AOM) can be used to simultaneously modulate and deflect a laser beam at a high speed, and also in an optical system using a plurality of laser beams, the laser beams can be modulated and deflected at a high speed independently of each other.

Further, according to the present invention, the above modulation and deflection of the laser beam can be attained just by displacing somewhat the position of an AOM in the optical system in a conventional exposure apparatus from the focal plane of the focusing lens without the necessity of providing any additional optical element. Because of the optical system configuration in which the laser light deflection is attain by wobbling the laser source, such adjustment as changing of the focal distance of the focusing lens can easily be done and light beams of different diameters can be incident upon the AOM.

Also, the frequency of laser beam deflection in the optical system using an AOM in the conventional exposure apparatus is about 1 MHZ in bandwidth. According to the present invention, however, the wobbling frequency in the optical system in which the AOM is provided off the focal plane of the focusing lens can be 3 MHZ or more in bandwidth. That is, the present invention provides an exposure apparatus capable of attain an exposure in a short time even when it is necessary to expose an optical disc substrate by light while the laser beam is being deflected at a high speed as in an exposure of a mastering disc on which the above-mentioned wide grooves are to be formed.

BRIEF DESCRIPTION OF THE DRAWINGS

These objects and other objects, features, aspects and advantages of the present invention will become more apparent from the following detailed description of the preferred embodiments of the present invention when taken in conjunction with the accompanying drawings, of which:

FIGS. 3A to 3D illustrate together the processes of exposing by light and stamping an optical disc substrate;

FIG. 5 is a view, from the lateral side, of the optical system on the moving optical surface plate of the exposure apparatus in FIG. 4;

FIGS. 6A and 6B show examples of the shape of grooves on the magneto-optic disc;

FIGS. 18A and 18B show together an example of recording format of an high recording density optical disc.

DETAILED DESCRIPTION OF THE PREFERRED EMBODIMENTS

Prior to proceeding to the further description of the present invention, the acousto-optic modulator (AOM) and acousto-optic deflector (AOD) making use of the previously mentioned acousto-optic effect will first be explained herebelow.

Figure 1A:
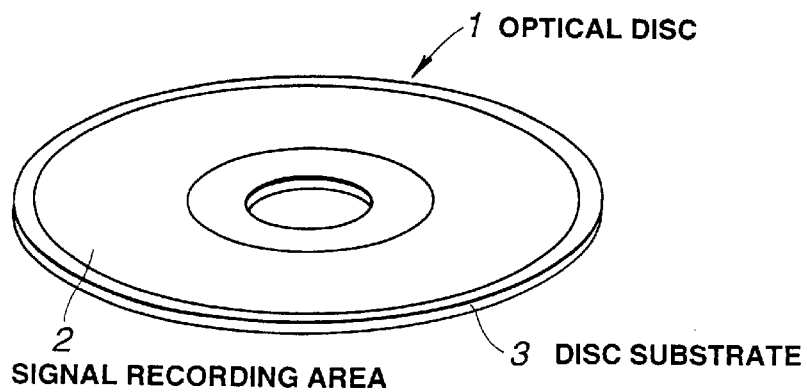
FIGS. 1A to 1C illustrate together the construction of an optical disc.
Figure 1B:
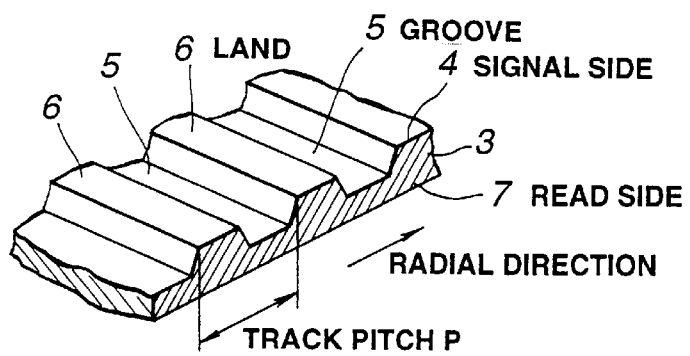
Figure 1C:
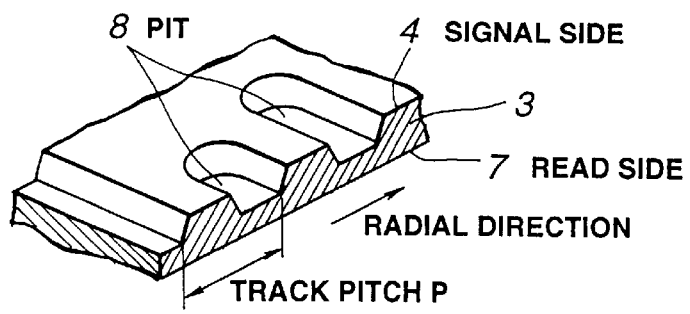
Figure 2A:
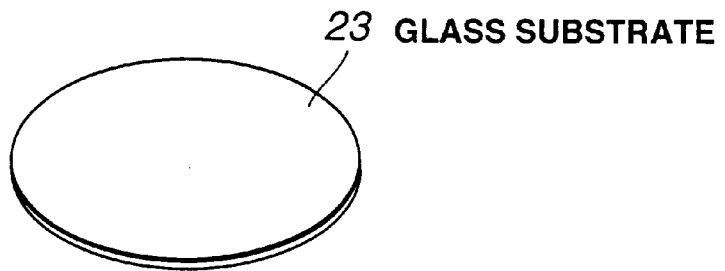
FIGS. 2A to 2C illustrate together the process of exposing an optical disc substrate by light.
Figure 2B:
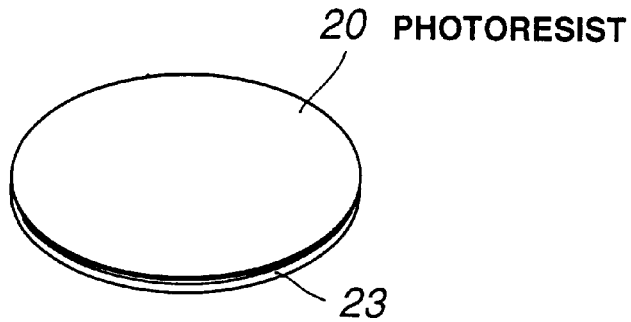
Figure 2C:
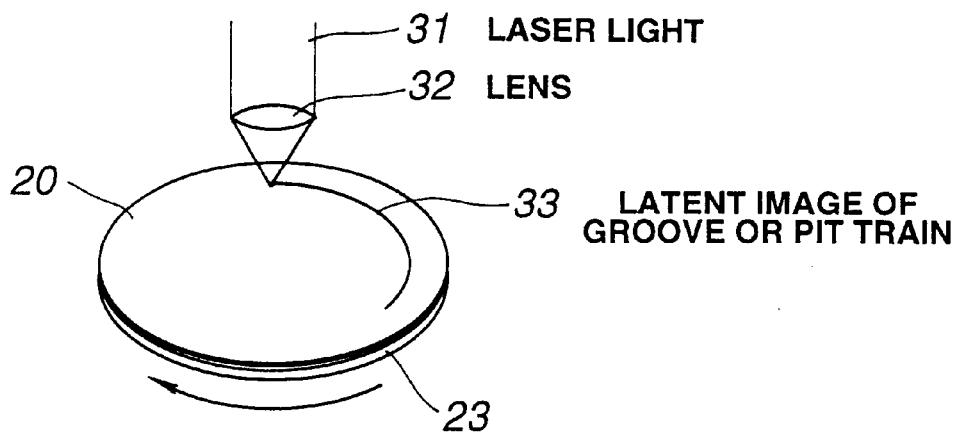
Figure 4:
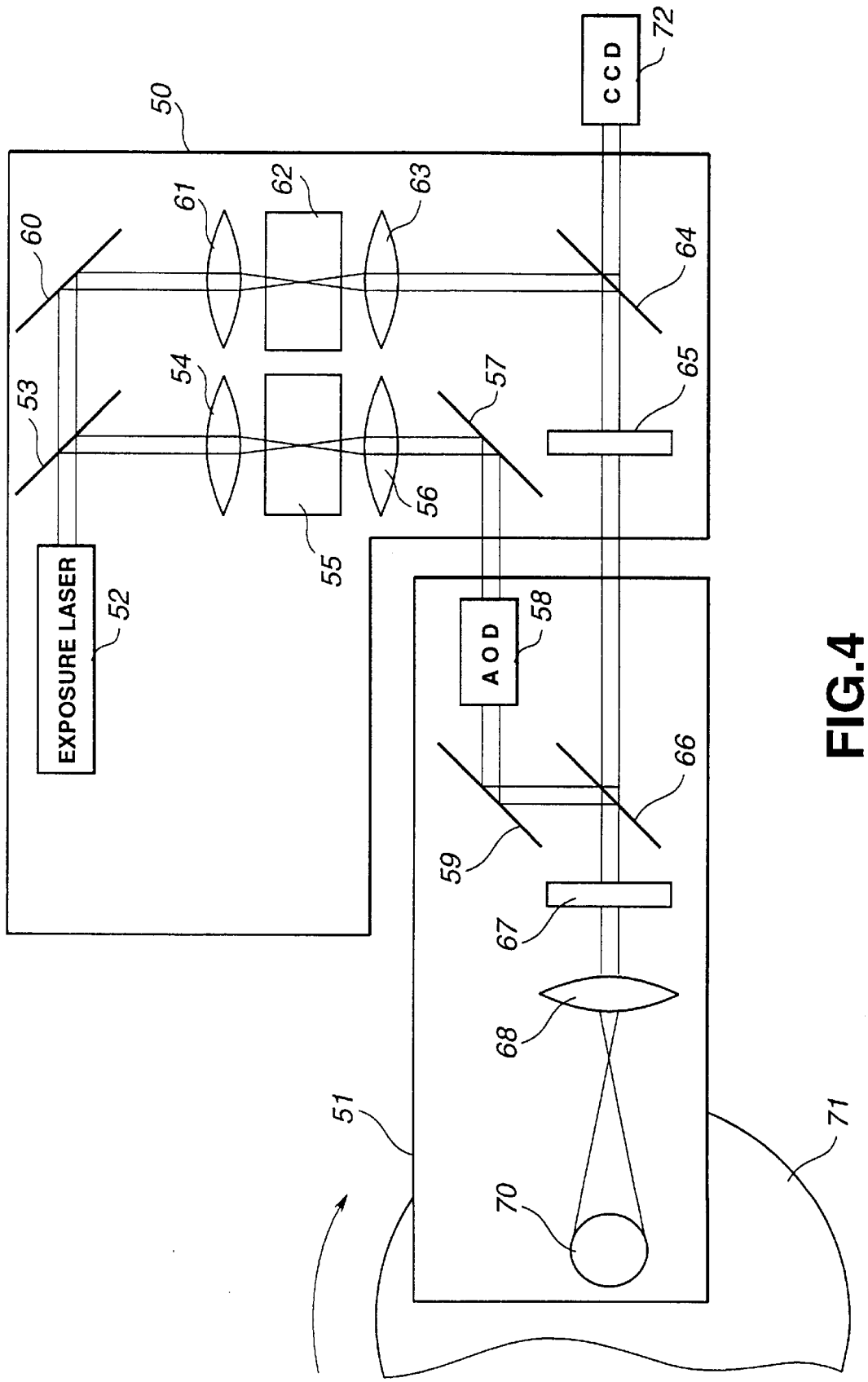
FIG. 4 shows an example of the optical system for a high recording density optical disc.
Figure 7:
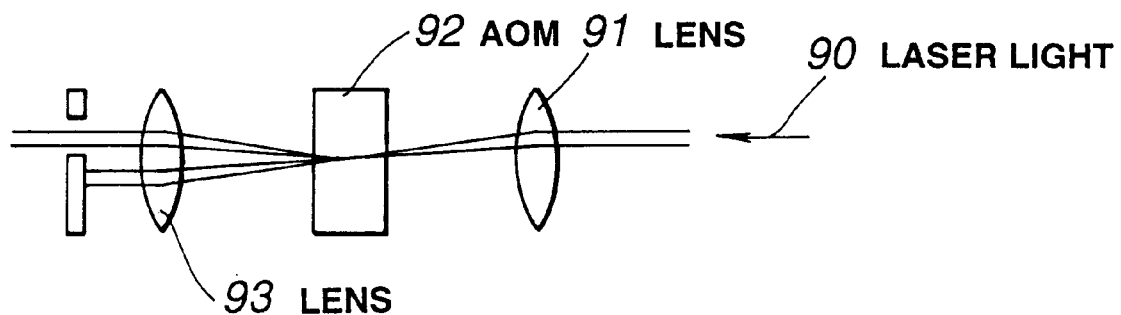
FIG. 7 shows an example of an optical system adapted to reduce the diameter of the laser beam passing through the AOM.
Figure 8:
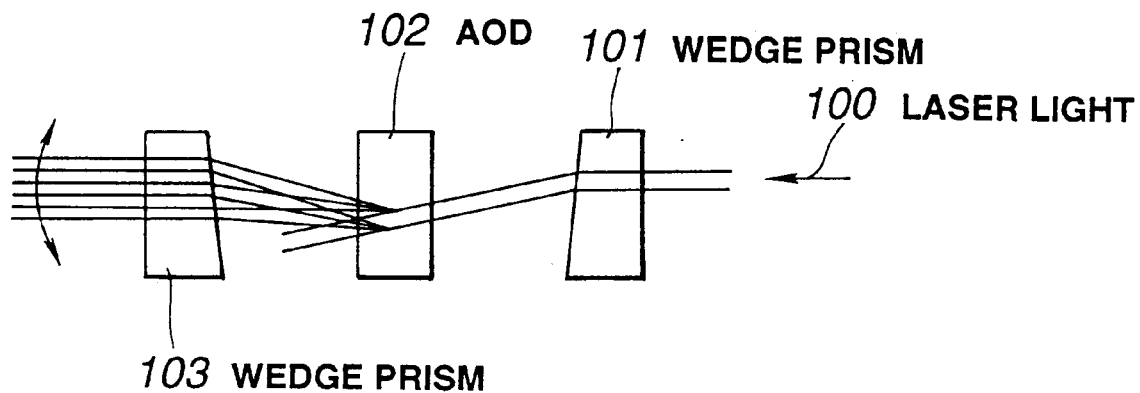
FIG. 8 shows an optical system in which a laser beam, not focused, is incident upon the AOD.
Figure 9:
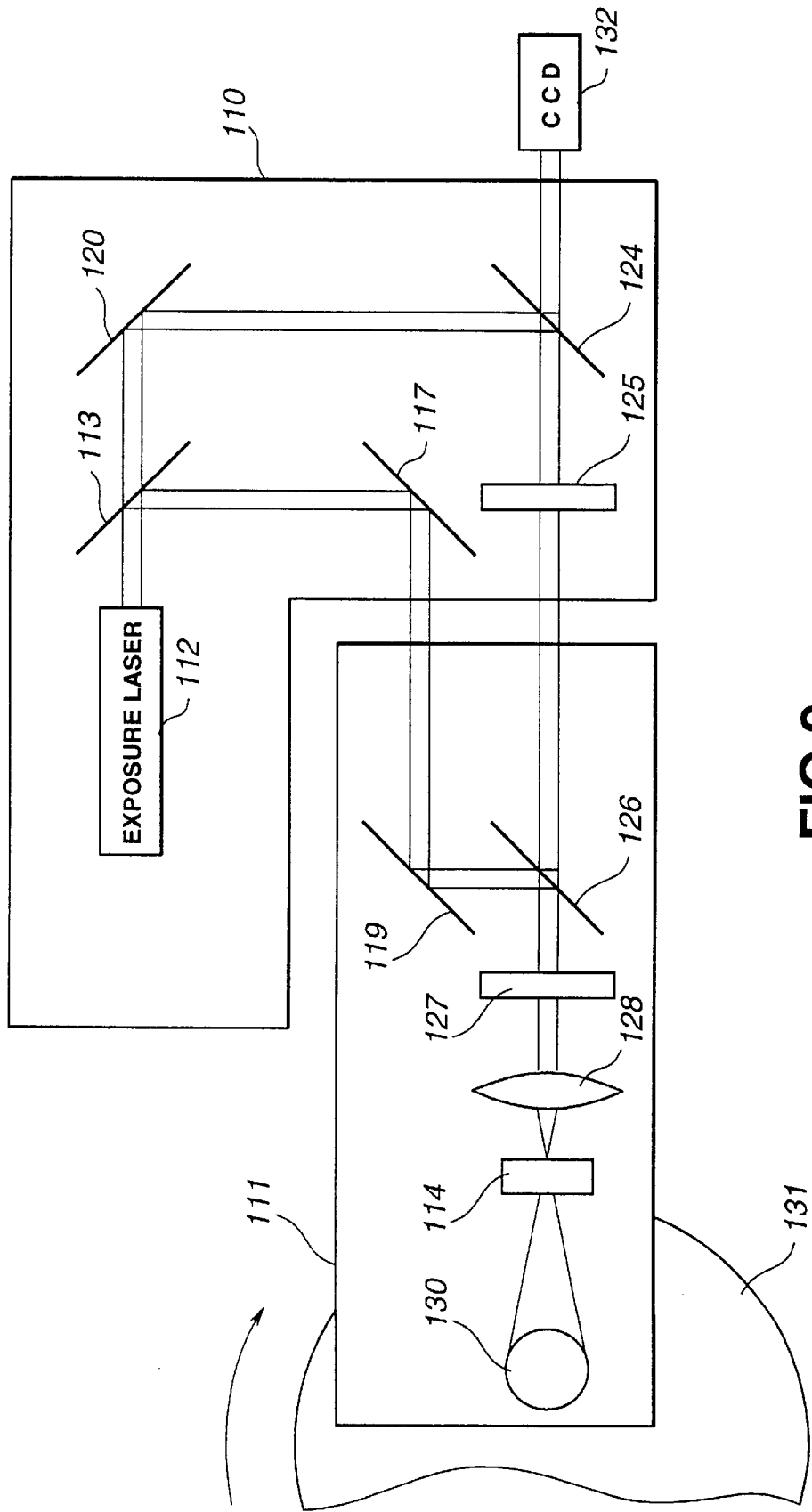
FIG. 9 shows an example of a conventional exposure apparatus intended for forming wide grooves.
Figure 10:
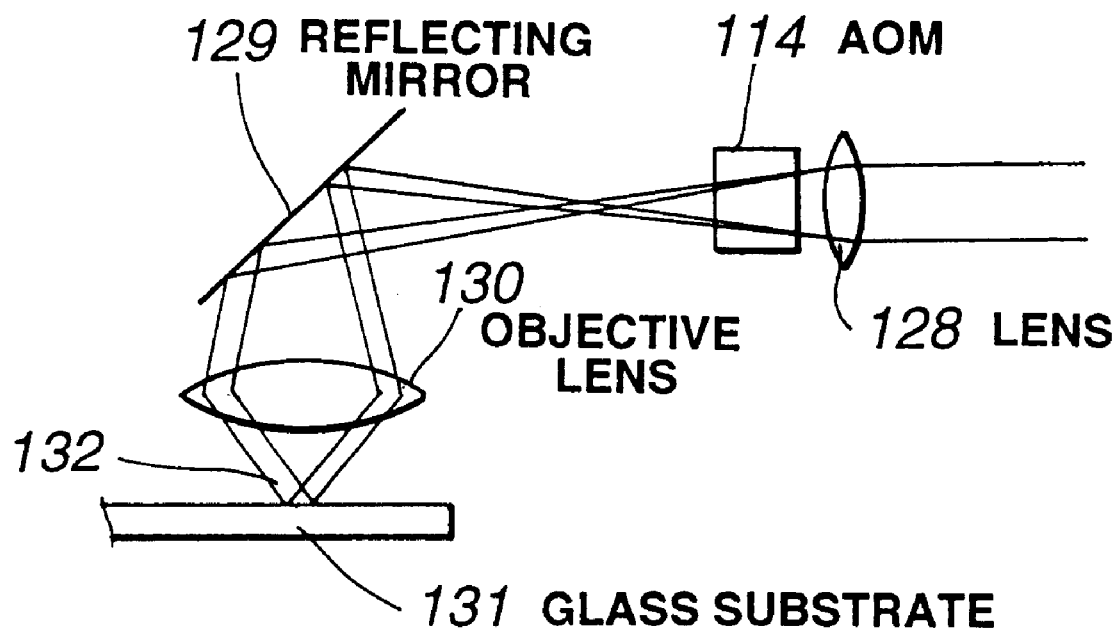
FIG. 10 is a view, from the lateral side, of the optical system on the moving optical surface plate of the exposure apparatus in FIG. 9.
Figure 11:
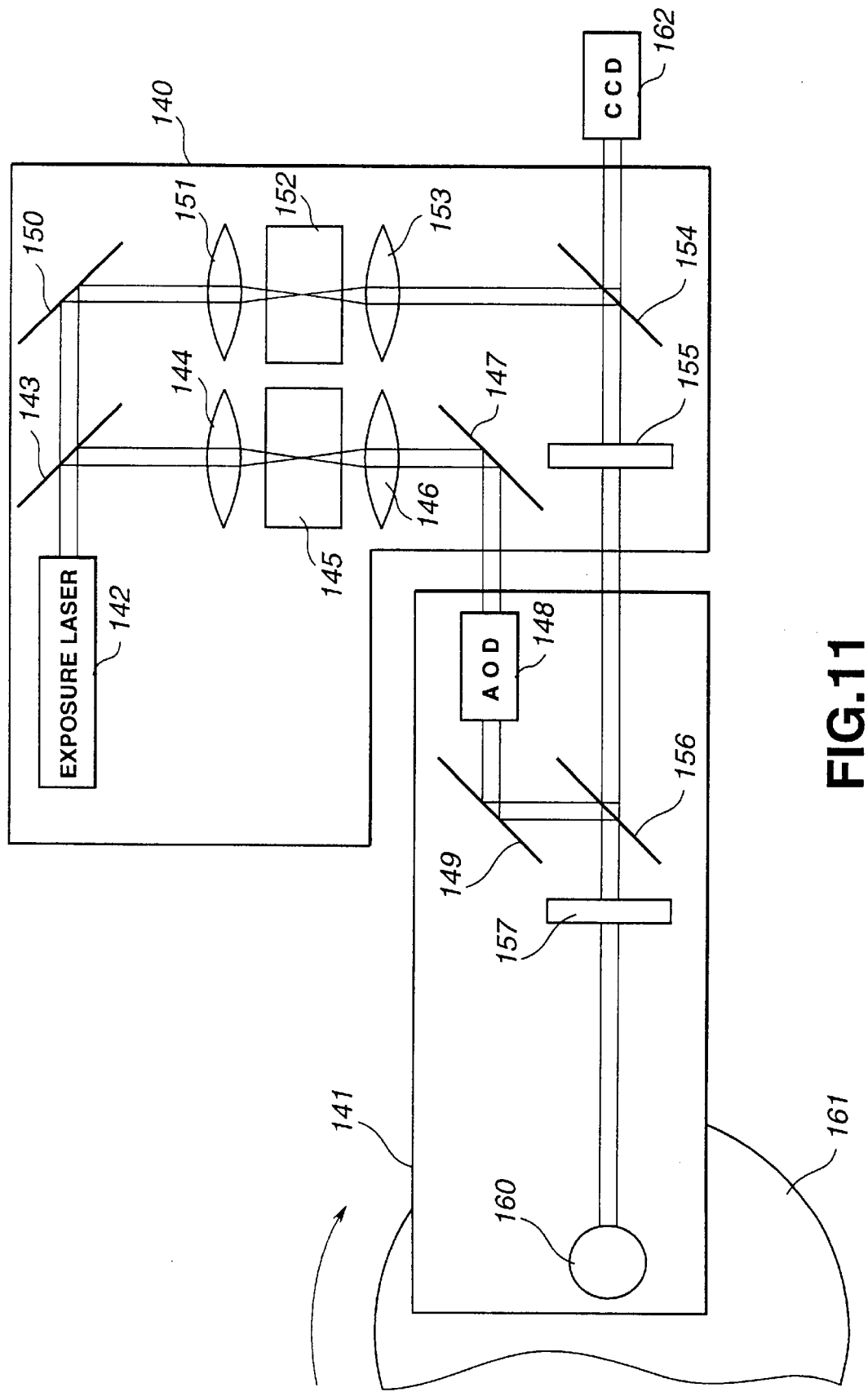
FIG. 11 shows an example of the optical system of a conventional exposure system comprising an optical system incorporating infinite objective lenses.
Figure 12:
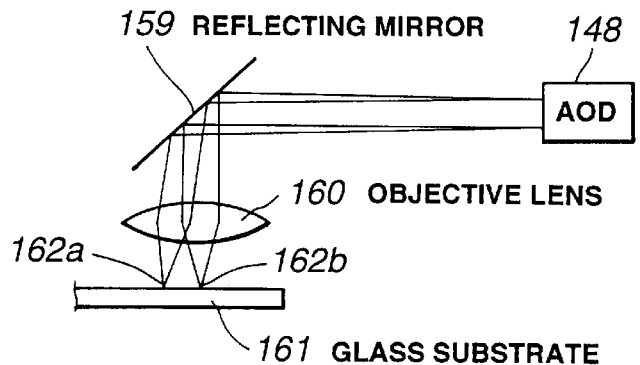
FIG. 12 a view, from the lateral side, of the optical system on the moving optical surface plate of the exposure apparatus in FIG. 11.
Figure 13:
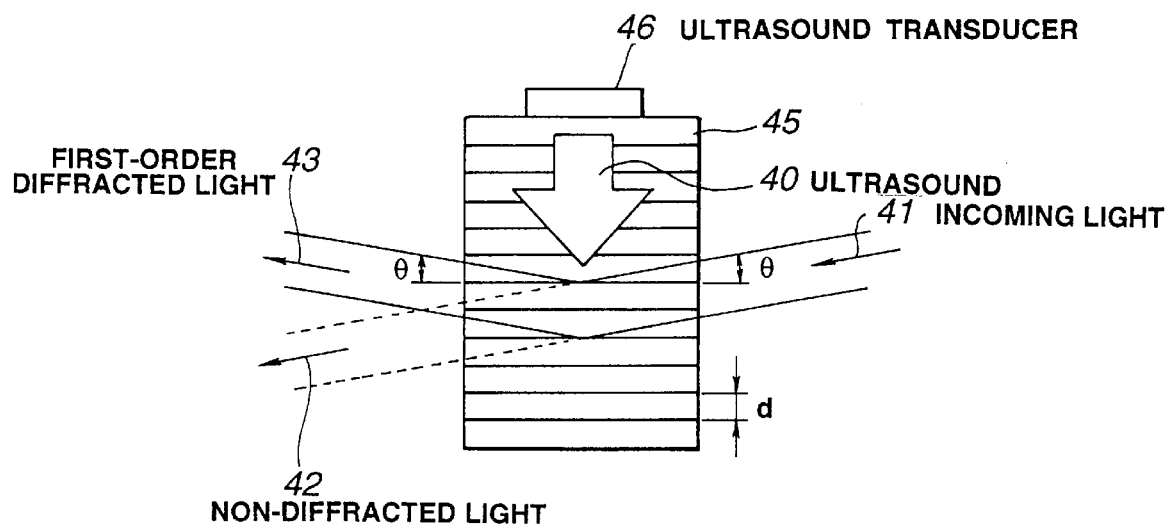
FIG. 13 illustrates the construction and operating principle of the acousto-optic modulator and deflector.

FIG. 13 shows the construction and operating principle of the acousto-optical effect element. When an ultrasound transducer 46 fixed to an optical crystal 45 is driven, an ultrasound 40 is incident upon the optical crystal 45 and propagates through it. In the optical crystal 45, there occurs a periodic change of refractive index corresponding to the wavelength and intensity of the ultrasound 40. The periodic changes of refractive index will substantially form a phased diffraction grating of intervals d. An incident light forming an angle θ with respect to the grating, the angle meeting the Bragg diffraction condition, is subject to Bragg diffraction. It should be noted that the ultrasound 40 propagating through the optical crystal 45 will be absorbed by an ultrasound absorbing material (not shown), causing no influence of its reflection.

The strength of a first-order diffraction resulted from the Bragg diffraction in the optical crystal 45 depends upon that of the ultrasound 40. Namely, when the ultrasound 40 has a small strength, the majority of the incoming laser light 41 becomes a non-diffracted (transmitted) light 42. On the contrary, when the strength of the ultrasound 40 is great, the majority of the incoming light 41 becomes a first-order diffracted light 43.

The AOM makes use of the above fact. By intermittently turning on and off the ultrasound 40 for application to the optical crystal 45, it is possible to select whether the first-order diffracted light 43 is available or not. More particularly, by intermittently driving the ultrasound transducer 46 according to a signal to be recorded, the strength of the ultrasound 40 can be modulated and the first-order diffracted light 43 going out of the optical crystal 45 be used as a light for irradiation onto the mastering disc on which a succession of pits is formed correspondingly to the signal to be recorded. It should be appreciated that in the following description, the "modulation" will also include the control for generation of the first-order diffracted light from the AOM.

Also, the angle of diffraction θ of the laser light propagating through the optical crystal 45 depends upon the frequency of the ultrasound 40 (carrier frequency). Namely, when the carrier frequency is changed with the incident angle of the incoming light 41 kept constant, a diffracted light will go out of the optical crystal 45 at an angle θ meeting the condition of Bragg diffraction.

The AOD makes use of this fact. By changing the frequency of the ultrasound 40 applied to the optical crystal 45, it is possible to control the outgoing direction of the first-order diffracted light 43. By periodically changing the frequency with which the ultrasound transducer 46 is driven, the frequency of the ultrasound 40 is periodically changed. Thereby, the direction of the first-order diffracted light 43 outgoing from the optical crystal 43 is periodically changed. The first-order diffracted light 43 thus periodically deflected can be used for irradiation onto the mastering disc to wobble the grooves and succession of pits to be formed on the mastering disc.

Figure 14:
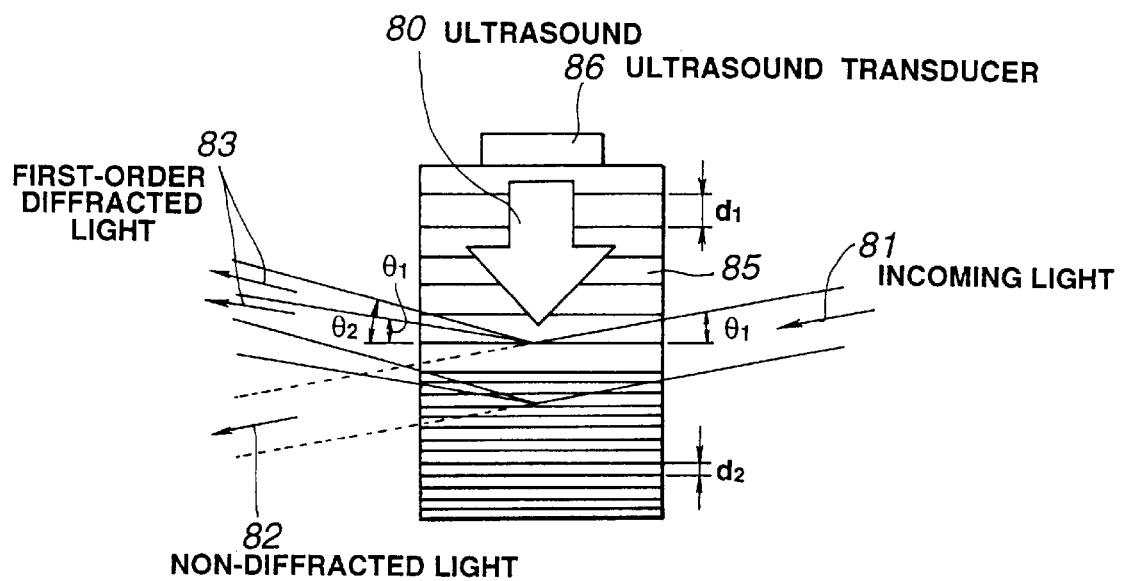
FIG. 14 illustrates how the period of refractive index compressional wave depends upon the position of the acousto-optic modulator and deflector in the optical crystal.

FIG. 14 schematically shows how the period of refractive index change depends upon the position of an acousto-optic effect element in an optical crystal.

When the frequency of an ultrasound 80 (carrier frequency) applied to an ultrasound transducer is constant, a refractive index wave stands in the optical crystal 85, so that the outgoing direction of the first-order diffracted light 43 is univocally determined. However, when the carrier frequency is changed with time to periodically deflect the laser light, a period of refractive index wave in the entire optical crystal 85 is changed to another, so that it takes some time. Namely, at this time, a period of refractive index wave in the optical crystal 85 differs depending upon the position. Further, the higher the deflecting speed (frequency), the narrower the area of the optical crystal 85 becomes in which the change of the refractive index is constant.

For example, if a compressional wave of intervals d1 and a one of intervals d2 exist in the optical path in the optical crystal 85 along which the incoming light 81 of a wavelength travels, a diffraction grating of intervals d1 and a diffraction grating of intervals d2 will exist in the optical crystal 85, as shown in FIG. 14. A first-order diffracted light 83 will go out of the diffraction grating having the intervals d1 at an angle θ1 meeting the condition of Bragg diffraction, and a first-order diffracted light 83 emerges from the diffraction grating of the intervals d2 at an angle θ2. This phenomenon is the aforementioned cylindrical effect.

Figure 15:
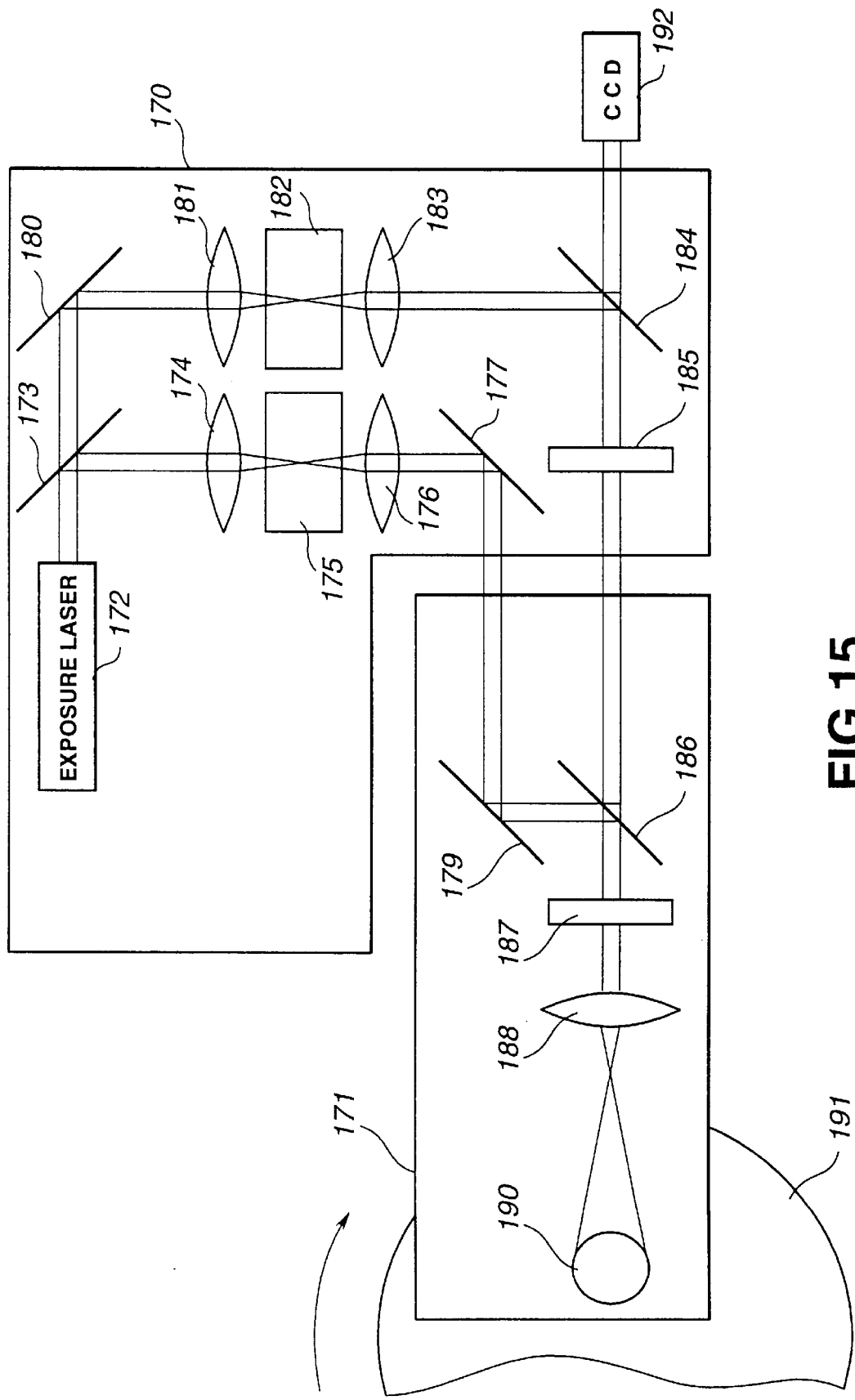
FIG. 15 shows a basic configuration of the optical system of the exposure apparatus according to the present invention.

FIG. 15 shows a configuration of an optical system in the exposure system according to the present invention adapted to deflect an exposure laser light at a high speed and deflect it at a sufficient amplitude against the above-mentioned problems of the acousto-optic effect elements.

As shown, the exposure apparatus has an optical path along which a laser light emitted from an exposure laser source 172 and split by a beam splitter 173 is modulated by an AOM 182, and an optical path along which the laser light emitted from the laser source 172 and reflected by the beam splitter 173 is modulated and deflected by an AOM 175. The laser beams having traveled along the respective optical paths are combined by a beam splitter 186 and irradiated onto a glass substrate 191.

When no deflection of the laser light is intended in the exposure apparatus, the laser light emitted from the exposure laser source 172 is reflected by a reflecting mirror 180 provided on a stationary optical surface plate 170, focused by a lens 181 into an AOM 182 in which it is modulated. A divergent light after thus modulated is collimated by a half wavelength plate 185, reflected by a beam splitter 184, passed through a polarizing beam splitter 186 and quarter wavelength plate 187 on a moving optical surface plate 171, focused by a lens 188, and then focused by an objective lens 190 onto the glass substrate 191. It should be noted that the half and quarter wavelength plates 185 and 187 are provided to prevent the laser beam from returning to the laser source.

Also, when the laser light is to be deflected in the exposure apparatus, the laser beam emerged from the exposure laser source 172 is reflected by a beam splitter 173 provided on the stationary optical surface plate 170, focused by a lens 174 into an AOM 175 in which it is modulated and deflected. This AOM 175 is located as displaced toward the laser source rather than to the focal plane of the lens 174. More specifically, the focal distance of the lens 174 is 80 mm and the AOM 175 is displaced 10 mm nearer to the laser source rather than to the focal plane of the lens 174 in this embodiment.

A divergent light after thus modulated by the AOM 175 is collimated by a lens 176, reflected by a reflective mirror 177, reflected by a reflecting mirror 179 and polarizing beam splitter 186 provided on the moving optical surface plate 171, passed through a quarter wavelength plate 187 and focused by a lens 188. Then it is focused by the objective lens 190 onto the glass substrate 191.

Also, a part of the laser light modulated by the AOM 182 is guided by the beam splitter 184 to a CCD 192 for monitoring.

Figure 16:
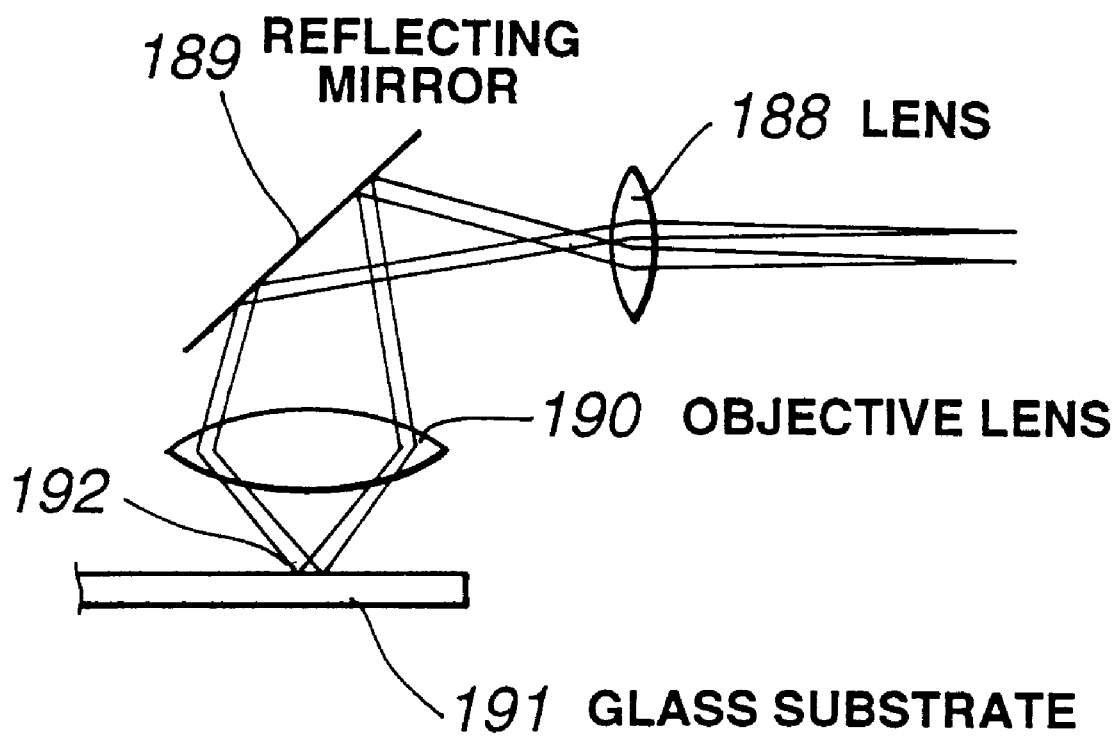
FIG. 16 is a view, from the lateral side, of the optical system on a moving optical surface plate of the exposure apparatus according to the present invention.

FIG. 16 is a view, from the lateral side, of the optical system on the moving optical surface plate 171 in the exposure apparatus. As shown, the light focused by the lens 188 is reflected downward by the reflecting mirror 189 and focused by the objective lens 190 onto a focused spot 192 on the glass substrate 191.

It should be noted that since the glass substrate 191 is turned on a turn table at a predetermined speed, it is spirally exposed to the laser light by parallel moving the moving optical surface plate 171 radially of the glass substrate 191.

Figure 17A:
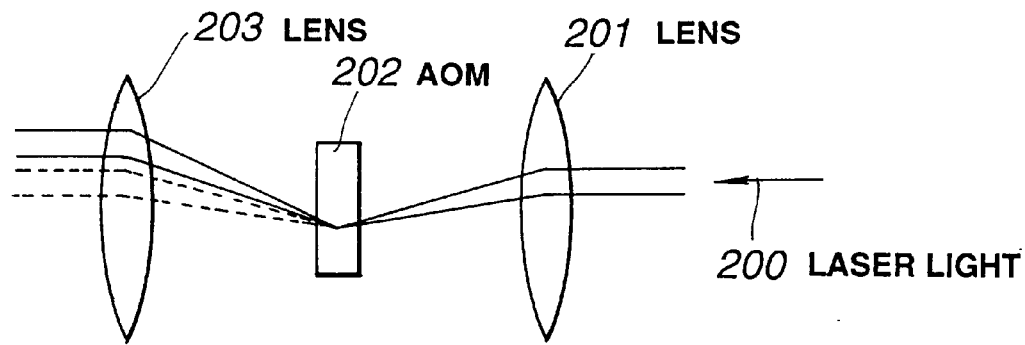
FIGS. 17A and 17B show the arrangement of the lenses and AOM in the exposure apparatus according to the present invention.

FIG. 17A shows the arrangement of the lenses and AOM in the optical system of a conventional exposure apparatus. As shown, when an AOM 202 is located at the focus of the lens 201, the focus of the lens 203 and the focused point are conjugate with each other so that the position of the focused spot on the substrate will not be shifted even if the laser light 200 is deflected by the AOM 202. Namely, such an optical system enables the laser beam to be modulated, but not wobbled.

Figure 17B:
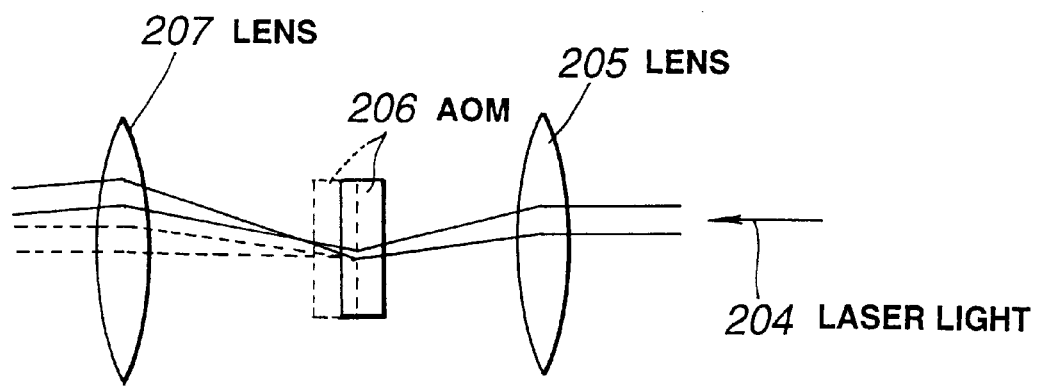

FIG. 17B shows an arrangement of lenses and AOM in an optical system in the exposure apparatus according to the present invention. As indicated with a dot line, when the AOM 206 is positioned somewhat off the focus of the lens, the AOM 206 receives a laser light 204 collimated to have a small diameter by the lens 205. Therefore, the laser beam can be modulated at a high speed and deflected at the same time by the AOM 206.

It should be noted that in case the amplitude of wobbling of the grooves or succession of pits on the mastering disc are required to be sufficient but the frequency of the wobbling may be low, the AOM 206 may be located as greatly displaced from the focus of the lens 205 along the optical axis. Also, when a high speed of wobbling is required while wobbling amplitude may be small, the AOM 206 may be located near the focus of the lens 205.

In this embodiment, as the carrier frequency is changed 41.3 MHZ with reference to 224.0 MHZ used for normal modulation, the wobbling amplitude on the glass substrate will be about 0.35 μm. At this time, the wobbling frequency is 1 MHZ. Note that the wobbling amplitude on the master disk did not change within a wobbling frequency range of DC to 3 MHZ.

As the recording density of the optical disk is further increased, the track pitch P is reduced to, for example, 0.8 μm or less, which is a half of the track pitch of a compact disc (CD). For a recording format in which pits are displaced a quarter of the track pitch P radially of the disk, the wobbling amplitude in the exposure apparatus may be on the order of 0.2 μm.

FIGS. 18A and 18B show examples of recording formats of optical discs having a larger recording density than the conventional optical disk.

FIG. 18A shows a format of an optical disk in which only one of the groove edges is wobbled. Grooves 215 are formed by two exposure laser beam spots 162a and 162b focused on a master disk by an optical system in which two laser beams can be controlled. FIG. 18B shows a recording format of an magneto-optical disk in which wobbling is done at a high speed and amplitude. Grooves 216 are formed on the disk by deflecting an exposure laser spot 192 at predetermined intervals at a high speed.

For a higher recording density of optical disk, an exposure apparatus is necessary which comprises an optical system adapted to provide a patterning of grooves and succession of pits corresponding to various formats. The exposure apparatus according to the present invention can modulate a laser light at a high speed and provide a sufficient wobbling amplitude, and thus can produce optical disks of all possible recording formats. Also, the present invention is applicable for an exposure apparatus using an infinite objective lens.

What is claimed is:

1. An exposure apparatus to expose by light a photo-sensitive layer formed on a substrate of a recording media, comprising:

an exposure light source;

a first means for focusing a light form the light source;

an acousto-optic modulator, disposed away from a focal point of the first focusing means, to modulate the light focused by the first focusing means according to a signal to be recorded;

a means for collimating the light modulated by said acousto-optic modulatar; and a second means of focusing the light modulated by the acousto-optic modulator, and collimated by the collimating means, onto the photo-sensitive layer formed on the substrate of the recording media.

2. The exposure apparatus as set forth in claim 1, wherein the acousto-optic modulator modulates and deflects the light focused by the first focusing means according to the signal to be recorded.

3. The exposure apparatus as set forth in claim 2, further comprising:

means of splitting the light from the light source into a plurality of beams; and means of combining into one beam the plurality of beams resulted from splitting by the beam splitting means;
the first focusing means and acousto-optic modulator being disposed nearer to the light source rather than to the beam combining means.

4. The exposure apparatus as set forth in claim 2, wherein the first focusing means and acousto-optic modulator are disposed in at least one of the plurality of optical paths resulted from splitting by the beam splitting means.

5. The exposure apparatus as set forth in claim 1, wherein the light source, first focusing means and acousto-optic modulator are fixed while at least the second focusing means is movable in relation to the recording means.

6. The exposure apparatus as set forth in claim 1, wherein the acousto-optic modulator comprises an optical element and an ultrasound transducing means of applying an ultrasound to the optical element.

7. An exposure apparatus to expose by light a photo-sensitive layer formed on a substrate of a recording media, comprising:

an exposure light source;

means for splitting the light from the light source into two beams;

two first means for focusing the split beams, respectively;

a first acousto-optic modulator, disposed away from a focal plane of one of the two first focusing means, to modulate the light focused by said one of the two first focusing means according to a signal to be recorded;

a first means for collimating the light modulated by said first acousto-optic modulator;

a second acousto-optic modulator, disposed at a focal point of the other of the two first focusing means, to modulate the light focused by the other of the two first focusing means according to a signal to be recorded;

a second means for collimating the light modulated by said second acousto-optic modulator;

means of combining into one beam the two beams resulted from splitting by the beam splitting means; and a second means of focusing the light modulated by the first and second acousto-optic modulators, and collimated by the first and second collimating means, onto the photo-sensitive layer formed on the substrate of the recording media.

8. The exposure apparatus as set forth in claim 7, wherein the acousto-optic modulator modulates and deflects the light focused by the first focusing means according to the signal to be recorded.

9. The exposure apparatus as set forth in claim 7, further comprising:

means of detecting the light modulated by the second acousto-optic modulator.

10. The exposure apparatus as set forth in claim 7, further comprising:

a quarter wavelength plate provided between the beam combining means and second focusing means.

11. The exposure apparatus as set forth in claim 10, further comprising:

a half wavelength plate provided between the second acousto-optic modulator and beam combining means.

12. The exposure apparatus as set forth in claim 7, wherein the acousto-optic modulator comprises an optical element and an ultrasound transducing means of applying an ultrasound to the optical element.

13. The exposure apparatus as set forth in claim 1, wherein said first focusing means, said acousto-optic modulator, and said collimating means are disposed on a stationary optical surface plate, while said second focusing means is disposed on a moving optical surface plate.

14. The exposure apparatus as set forth in claim 7, wherein said two first focusing means, said first and second acousto-optic modulators, and said first and second collimating means are disposed on a stationary optical surface plate, while said second focusing means is disposed on a moving optical surface plate.

* * * * *